(12) United States Patent
Hansen

(10) Patent No.: US 7,180,576 B2
(45) Date of Patent: *Feb. 20, 2007

(54) EXPOSURE WITH INTENSITY BALANCING TO MIMIC COMPLEX ILLUMINATOR SHAPE

(75) Inventor: Steven George Hansen, Phoenix, AZ (US)

(73) Assignee: ASML Netherlands B.V., Veldhoven (NL)

( * ) Notice: Subject to any disclaimer, the term of this patent is extended or adjusted under 35 U.S.C. 154(b) by 87 days.

This patent is subject to a terminal disclaimer.

(21) Appl. No.: 10/889,216

(22) Filed: Jul. 13, 2004

(65) Prior Publication Data

US 2005/0018164 A1    Jan. 27, 2005

Related U.S. Application Data

(63) Continuation-in-part of application No. 10/361,831, filed on Feb. 11, 2003, now Pat. No. 6,839,125, which is a continuation-in-part of application No. 10/716,439, filed on Nov. 20, 2003, which is a continuation-in-part of application No. 10/773,397, filed on Feb. 9, 2004.

(51) Int. Cl.
*G03B 27/54* (2006.01)
*G03B 27/42* (2006.01)
*G03B 27/72* (2006.01)
*G03B 27/32* (2006.01)
*G06F 17/50* (2006.01)

(52) U.S. Cl. .............. 355/67; 355/53; 355/71; 355/77; 703/13; 430/30

(58) Field of Classification Search .......... 355/53, 355/67, 71, 77; 703/13, 22; 430/30
See application file for complete search history.

(56) References Cited

U.S. PATENT DOCUMENTS 5,305,054 A    4/1994   Suzuki et al.

(Continued)

FOREIGN PATENT DOCUMENTS

EP    0 500 393    11/1997

(Continued)

OTHER PUBLICATIONS

Burkhardt et al., "Illuminator Design for the Printing of Regular Contact Patterns," *Microelectronic Engineering*, vol. 41, No. 42, 1998, pp. 91-96.

(Continued)

*Primary Examiner*—Alan Mathews
(74) *Attorney, Agent, or Firm*—Pillsbury Winthrop Shaw Pittman, LLP

(57) ABSTRACT

A method for optimizing the optical transfer of a mask pattern onto a substrate using a lithographic apparatus, the lithographic apparatus including an illuminator configured to illuminate the mask pattern, the method including determining a plurality of illumination arrangements for a pupil plane of the illuminator, each of the plurality of illumination arrangements being determined to improve a respective lithographic performance response parameter when illuminating the mask pattern; and adjusting an intensity of a first illumination arrangement of the plurality of illumination arrangements relative to a second illumination arrangement of the plurality of illumination arrangements, the mask pattern to be illuminated with the first and second illumination arrangements. The mask pattern may be illuminated at least once for each of the first and second illumination arrangements or all at once with at least the first illumination arrangement and the second illumination arrangement.

35 Claims, 11 Drawing Sheets

U.S. PATENT DOCUMENTS

| | | | |
|---|---|---|---|
| 5,523,193 | A | 6/1996 | Nelson |
| 5,680,588 | A | 10/1997 | Gortych et al. |
| 6,049,660 | A | 4/2000 | Ahn et al. |
| 6,452,662 | B2 | 9/2002 | Mulkens et al. |
| 6,463,403 | B1 | 10/2002 | Burdorf et al. |
| 6,466,304 | B1 | 10/2002 | Smith |
| 6,671,035 | B2 | 12/2003 | Eurlings et al. |
| 6,737,662 | B2 | 5/2004 | Mulder et al. |
| 2002/0035461 | A1 | 3/2002 | Chang et al. |
| 2002/0045106 | A1 | 4/2002 | Baselmans et al. |
| 2002/0062206 | A1 | 5/2002 | Liebchen |
| 2002/0152452 | A1 | 10/2002 | Socha |
| 2002/0167653 | A1 | 11/2002 | Mulkens et al. |
| 2003/0038225 | A1 * | 2/2003 | Mulder et al. .............. 250/205 |
| 2003/0073013 | A1 | 4/2003 | Hsu et al. |
| 2003/0082463 | A1 | 5/2003 | Laidig et al. |
| 2003/0093251 | A1 | 5/2003 | Chang |
| 2003/0223050 | A1 | 12/2003 | Fritze et al. |

FOREIGN PATENT DOCUMENTS

| | | |
|---|---|---|
| EP | 0 486 316 | 4/2000 |
| EP | 0 496 891 | 5/2000 |
| EP | 1 109 067 A2 * | 6/2001 |

OTHER PUBLICATIONS

Chen et al., "Practical Method for Full-Chip Optical Proximity Correction," *SPIE*, vol. 3051, 1997, pp. 790-803.

Chen et al., "Optical Proximity Correction for Intermediate-Pitch Features Using Sub-Resolution Scattering Bars," *Journal of Vacuum Science & Technology B*, vol. 15, No. 6, Nov./Dec. 1997, pp. 2426-2433.

Flagello et al., "Lithographic Lens Testing: Analysis of Measured Aerial Images, Interferometric Data and Photoresist Measurements," *SPIE Microlithography Seminar*, 1996.

Flagello et al., "Towards a Comprehensive Control of Full-Field Image Quality in Optical Photolithography," *SPIE Microlithography Seminar*, Mar. 1997.

Gau et al., "Strategy to Manipulate the Optical Proximity Effect by Post-Exposure Bake Processing," *SPIE*, vol. 3334, 1998, pp. 885-891.

Gau et al., "The Customized Illumination Aperture Filter for Low k1 Photolithography Process," *SPIE*, vol. 4000, Mar. 2000, pp. 271-282.

Hsia et al., "Customized Off-Axis Illumination Aperture Filtering for Sub-0.18 µm KrF Lithography," *SPIE*, vol. 3679, Mar. 1999, pp. 427-434.

Liu et al., "The Application of Alternating Phase-Shifting Masks to 140 nm Gate Patterning: Line Width Control Improvements and Design Optimization," *SPIE*, vol. 3236, 1998, pp. 328-337.

Smith et al., "Illumination Pupil Filtering Using Modified Quadrupole Apertures," *SPIE*, vol. 3334, 1998, pp. 384-394.

Suzuki et al., "Multilevel Imaging System Realizing $k_1$=0.3 Lithography," *SPIE*, vol. 3679, Mar. 1999, pp. 396-407.

Wong et al., "Level-Specific Lithography Optimization for 1-Gb DRAM," *IEEE Transactions on Semiconductor Manufacturing*, vol. 13, No. 1, Feb. 2000, pp. 76-87.

* cited by examiner

EXPOSURE WITH INTENSITY BALANCING TO MIMIC COMPLEX ILLUMINATOR SHAPE

This application is a Continuation-In-Part of U.S. patent application Ser. No. 10/361,831, filed on Feb. 11, 2003 now U.S. Pat. No. 6,839,125, entitled "Method for Optimizing an Illumination Source Using Full Resist Simulation and Process Window Metric", U.S. patent application Ser. No. 10/716,439, filed on Nov. 20, 2003, entitled "Lithographic Apparatus and Method for Optimizing an Illumination Source Using Isofocal Compensation", and U.S. patent application Ser. No. 10/773,397, filed on Feb. 9, 2004, entitled "Lithographic Apparatus And Method For Optimizing An Illumination Source Using Photolithographic Simulations". The contents of these applications are incorporated herein in their entirety by reference.

FIELD

The present invention relates to a method for optimizing the conditions of illumination of a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device (or patterning structure), which is alternatively referred to as a mask or a reticle, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

One of the goals in integrated circuit fabrication is to faithfully reproduce the original design on the substrate (via the mask). As the demand to image smaller and smaller features in the semiconductor manufacturing process has continued unabated, the limitations of optical lithography that were once accepted have been exceeded repeatedly.

A theoretical estimate of the limits of pattern printing can be given by the Rayleigh criterion for resolution R as shown in equation (a):

$$R = k_1 * \frac{\lambda}{NA} \tag{a}$$

where $\lambda$ is the wavelength of the radiation used, NA is the numerical aperture of the projection system and $k_1$ is a process dependent adjustment factor.

It follows from equation (a) that the resolution can be improved in three ways: by shortening the exposure wavelength $\lambda$, by increasing the numerical aperture NA or by decreasing the value of $k_1$. All of these strategies have been pursued simultaneously in the past and are expected to continue to be pursued in the future.

The performance of a lithographic apparatus and its limitation may also be explained and characterized with the depth of focus (DOF), which is generally viewed as one of the most critical factors in determining the resolution of the lithographic projection apparatus. The DOF, defined in equation (b), is defined as the distance along the optical axis over which the image of the pattern is adequately sharp.

$$DOF = +/-k_2 * \frac{\lambda}{NA^2} \tag{b}$$

where $k_2$ is an empirical constant.

Additional important responses/measures that provide more insight into the real difficulties associated with photolithography at the resolution limit include the exposure latitude (EL), the dense:isolated bias (DIB), and the mask error enhancement factor (MEEF). The exposure latitude describes the percentage dose range where the printed pattern's critical dimension (CD) is acceptable, typically 10%. It is used along with the DOF to determine the process window, i.e. the regions of focus and exposure that keep the final resist profile within prescribed specifications. As for the DIB, it is a measure of the size difference between similar features, depending on the pattern density. Finally, the MEEF describes how mask CD errors are transmitted into substrate CD errors.

As the semiconductor industry moves into the deep submicron regime, the resolution limit of currently available lithographic techniques is being reached due to a decrease in the depth of focus, difficulty in the design of projection system and complexities in the projection system fabrication technology. In order to address this issue, there have been continued endeavors to develop resolution enhancement techniques.

Historically, the resolution limit of a lithographic projection apparatus was optimized by the control of the relative size of the illumination system numerical aperture (NA). Control of this NA with respect to the projection system's NA allows for modification of spatial coherence at the mask plane, commonly referred to as partial coherence σ. This is accomplished, for example, through specification of the condenser lens pupil in a Köhler illumination system. Essentially, this allows for manipulation of the optical processing of diffraction information. Optimization of the partial coherence of a projection imaging system is conventionally accomplished using full circular illumination apertures. By controlling the distribution of diffraction information in the projection system with the illuminator pupil size, maximum image modulation can be obtained. Illumination systems can be further refined by considering variations to full circular illumination apertures. A system where illumination is obliquely incident on the mask at an angle so that the zero-th and first diffraction orders are distributed on alternative sides of the optical axis may allow for improvements. Such an approach is generally referred to as off-axis illumination.

Off-axis illumination improves resolution by illuminating the mask with radiation that is at an angle to the optical axis of the projection system. The angular incidence of the radiation on the mask, which acts as a diffraction grating, improves the contrast of the image by transmitting more of the diffracted orders via the projection system. Off-axis illumination techniques used with conventional masks produce resolution enhancement effects similar to resolution enhancement effects obtained with phase shifting masks.

Various other enhancement techniques that have been developed to increase the resolution and the DOF include optical proximity correction (OPC) of optical proximity errors (OPE), phase-shift masks (PSM), and sub-resolution assist features (SRAF). Each technique may be used alone, or in combination with other techniques to enhance the resolution of the lithographic projection apparatus.

One approach to generate off-axis illumination is to incorporate a metal aperture plate filter into a fly eye lens assembly of the projection system illuminator in order to provide oblique illumination. A pattern on such a metal plate could have two or four symmetrically arranged openings (zones) with sizing and spacing set to allow diffraction order overlap for specific geometry sizing and duty ratio on the mask. Such an approach results in a significant loss in intensity available to the mask, lowering throughput and making the approach less than desirable. Additionally, the two or four circular openings need to be designed specifically for certain mask geometry and pitch and do not improve the performance of other geometry sizes and spacings. See, for example, EP 0 500 393, U.S. Pat. Nos. 5,305,054, 5,673,103, 5,638,211, EP0 496 891 and EP0 486 316.

Another approach to off-axis illumination using the four-zone configuration, which is disclosed in U.S. Pat. No. 6,452,662, is to divide the illumination field of the projection system into beams that can be shaped to distribute off-axis illumination to the mask. By incorporating the ability to shape off-axis illumination, throughput and flexibility of the lithographic apparatus may be maintained. Additionally, this approach allows for illumination that combines off-axis and on-axis (conventional) characteristics. By doing so, the improvement to dense features that are targeted with off-axis illumination is less significant than straight off-axis illumination. The performance of less dense features, however, is more optimal because of the more preferred on-axis illumination for these features. The result is a reduction in the optical proximity effect between dense and isolated features. Optimization is less dependent on feature geometry and more universal illumination conditions can be selected.

Referring to FIGS. 3a–d, currently available illumination intensity distributions or arrangements include small, or low, sigma (FIG. 3a), annular (FIG. 3b), and off-axis quadrupoles (FIGS. 3c–d), with the illuminated areas (hereinafter referred to as the aperture(s)) shown in cross section. In FIG. 3d, the off-axis quadrupole illumination includes four substantially identical poles arranged at +/−45° relative to the horizontal axis of the illuminator. Each of these poles corresponds to a segment of an annular illumination and may be obtained with the optical assembly of FIG. 10. This illumination may be referred to as "QUASAR" type illumination in the remaining text. The annular, quadrupole and QUASAR illumination techniques of FIGS. 3b–d are examples of off-axis illumination schemes.

Small sigma illumination is incident on the mask with approximately zero illumination angle (i.e. almost perpendicular to the mask) and produces good results with phase shifting masks to improve resolution and increase the depth of focus. Annular illumination is incident on the mask at angles that are circularly symmetrical and improves resolution and increases depth of focus while being less pattern dependent than other illumination schemes. Quadrupole and QUASAR illumination are incident on the mask with four main angles and provide improved resolution and increased depth of focus while being strongly pattern dependent.

Referring to FIGS. 4 and 5, two illumination systems are schematically illustrated. The systems illustrated in FIGS. 4 and 5 include light collecting/collimating optics 10; an axicon/zoom module 12; and light integrating and projecting optics 14. The illumination systems include an optical axis 16, a pupil plane 31, and a mask plane 20. The axicon/zoom module 12 comprises a pair of axicons 33, one concave and one convex, whose separation can be varied. The module 12 also comprises a zoom lens 24.

For the case of conical axicons, some examples of the illumination intensity distributions achievable at the pupil plane 31 are shown in FIG. 6. The spot size can be varied between states A and B by changing the zoom lens position. Similarly, the annularity can be changed between states A and C by varying the axicon opening (separation between the axicons).

To improve the illumination homogeneity, an optical integrator 26 is used. In FIG. 4 the optical integrator takes the form of a light pipe 26, such as a glass, calcium fluoride or quartz rod. A coupler 28 couples the illumination at the pupil plane 31 into the rod 26, and rod exit imaging optics 30 are also provided. In FIG. 5 a fly's eye element 32 acts as the integrator. The fly's eye element 32 is a composite lens comprising an array or honeycomb of small lenses. Further, objective lenses 34 and 36 complete the projection optics 14.

However, the creation of complex source shapes to optimize the optical transfer of a given mask pattern remains a slow and expensive process. Even the production of small sigma poles, e.g. smaller than 0.1, with commercially available beam shapers can potentially be complicated. Complex source shapes that cannot be generated with, for example, an axicon module generally require the use of custom elements, which are specifically designed to provide a particular intensity distribution at the pupil plane of the illuminator. Unfortunately, these custom elements are expensive and cannot generally be modified if they do not provide the intended results.

SUMMARY

Embodiments of the invention include a method for optimizing the optical transfer of a mask pattern onto a substrate using a lithographic apparatus, the lithographic apparatus including an illuminator configured to illuminate the mask pattern. In an embodiment of the invention, the method includes determining a plurality of illumination arrangements for a pupil plane of the illuminator, each of the plurality of illumination arrangements being determined to improve a respective lithographic performance response parameter when illuminating the mask pattern, and adjusting an intensity of a first illumination arrangement of the plurality of illumination arrangements relative to a second illumination arrangement of the plurality of illumination arrangements, the mask pattern to be illuminated with the first and second illumination arrangements.

In an embodiment of the invention, the mask pattern is illuminated at least once for each of the first and second illumination arrangements. In another embodiment of the invention, the mask pattern is illuminated all at once with at least the first illumination arrangement and the second illumination arrangement.

In yet another embodiment of the invention, there is provided a lithographic projection apparatus. In an embodiment of the invention, the apparatus includes an illumination system to condition a beam of radiation, a support structure to hold a patterning structure which can be used to pattern the beam of radiation according to a desired pattern, a substrate table to hold a substrate, a projection system to project the beam of radiation onto a target portion of the substrate, a processor to determine a plurality of illumination arrangements for a pupil plane of the illumination system, each of the plurality of illumination arrangements being determined to improve a respective lithographic performance response parameter when illuminating the desired pattern, and to adjust an intensity of a first illumination arrangement of the plurality of illumination arrangements relative to a second illumination arrangement of the plurality of illumination arrangements, and a selectable variable beam controller that is configured to modify a cross-sectional intensity distribution of the beam exiting the illumination system in accordance with the plurality of illumination arrangements determined and adjusted by the processor.

In another embodiment of the invention, there is provided a machine readable medium encoded with machine executable instructions for optimizing an illumination arrangement of an illuminator. In an embodiment of the invention, the optimization of the illumination arrangement is done according to a method including determining a plurality of illumination arrangements for a pupil plane of the illuminator, each of the plurality of illumination arrangements being determined to improve a respective lithographic performance response parameter when illuminating a mask pattern, and adjusting an intensity of a first illumination arrangement of the plurality of illumination arrangements relative to a second illumination arrangement of the plurality of illumination arrangements, the mask pattern to be illuminated with the first and second illumination arrangements.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "illumination arrangement" should be broadly interpreted as an area or region in the pupil plane of the illuminator which illuminates the mask or patterning structure. In this context, the term "illumination arrangement" may also be interpreted as a light intensity distribution. Examples of illumination arrangement may include, but are not limited to, a dipole, a quadrupole, a C-Quad arrangement, a central pole, etc. In this context, it should be understood that a dipole is an arrangement including two off-axis poles whose axis of separation is perpendicular to the lines being imaged. It should also be understood that a quadrupole (or a Quasar illumination) corresponds to an arrangement having four poles distributed symmetrically about the central axis and oriented at 45° relative the pattern's symmetry axes. A rotated quadrupole (or Cquad illumination) has the poles aligned with the pattern's symmetry axes.

It will be appreciated that the term "illumination arrangement" may also refer to a sub-region or a sub-area of a main region or area of the illuminator. For example, each pole of a multipole illumination arrangement (e.g. a dipole) may be considered as an illumination arrangement.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to device that can be used to impart a beam of radiation with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports the patterning device. It holds the patterning device in a way depending on the orientation of the patterning device, the design of the lithographic apparatus, and other conditions, such as for example whether or not the patterning device is held in a vacuum environment. The support may use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion liquid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
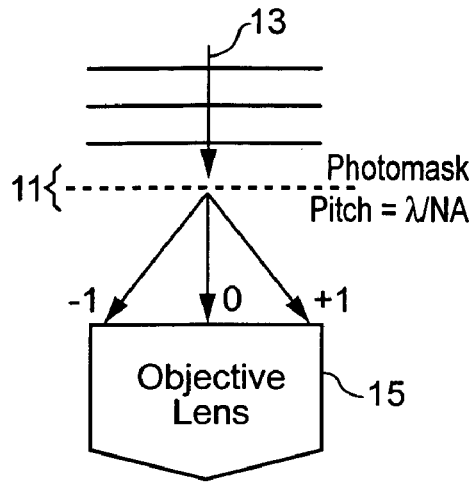
FIGS. 1a–d illustrate how the utilization of off-axis illumination techniques allow for reduction in the minimum pitch that can be imaged by a lithography apparatus.

Embodiments of the invention include methods and apparatus to improve a lithographic process without resorting to the use of expensive custom apertures or optics to produce complex source shapes. Since the image of the mask pattern on the substrate is the sum of the images of all the individual source points in the illuminator, optimization of the optical transfer of the mask pattern may be done using a single or multiple illuminations. Thus, it is possible to deliver an integrated image of the mask pattern all at once or in temporally separated exposures.

In an embodiment of the invention, the method for optimizing the optical transfer of the mask pattern includes determining a plurality of illumination arrangements for a pupil plane of the illuminator, each of the plurality of illumination arrangements being determined to improve a respective lithographic performance response parameter when illuminating the mask pattern, and adjusting an intensity of a first illumination arrangement of the plurality of illumination arrangements relative to a second illumination arrangement of the plurality of illumination arrangements, the mask pattern to be illuminated with the first and second illumination arrangements.

In an embodiment of the invention, the mask pattern is illuminated at least once for each of the first and second illumination arrangements. In another embodiment of the invention, the mask pattern is illuminated all at once with at least the first illumination arrangement and the second illumination arrangement. This latter illumination may be carried out using, for example, a variable transmission illuminator.

In adjusting the relative intensity of separate illumination arrangements, it may be possible for the chipmaker to empirically find the best lithographic conditions (e.g. process window) for a given process. In addition, by controlling the intensity of the poles in the lithographic apparatus, the chipmaker can easily optimize a single exposure process.

Optimization or improvement of the plurality of illumination arrangements, which may consist of disconnected regions of the illuminator, may be done through the use of simulation. In that way, it is possible to quickly determine which region(s) of the illuminator contributes the most to a particular lithographic performance (e.g., depth of focus or exposure latitude). The simulation may also indicate the appropriate weightings for these regions that provide the best illumination condition. Experimental verification may then be carried out to optimize the weightings found by simulation.

Prior to discussing the details of several embodiments of the present invention, a brief discussion of the technology involved is provided in order to facilitate the understanding of embodiments of the present invention. Imaging of any particular pattern feature is typically the result of the lens of an imaging system capturing the radiation, which is diffracted by an image at the object plane, as the wave front passes by. The resulting diffraction pattern that is created by this object can be relatively simple as would be the case for an infinite series of line/space patterns, or extremely complex in the case of a completely random pattern. Each part of this diffracted radiation contains information about the image and plays a role in the formation of the image at the image plane. When the imaging system does not capture portions of the diffracted radiation, information (elements of the pattern contained within that radiation) is lost and the image is degraded. The effect is that the imaging system acts as a low pass spatial frequency filter in optical lithography.

As the best imaging of a particular spatial frequency component of a pattern is done with a specific coherency that matches the spatial frequency of that component, it is desirable to control the illumination conditions in a manner that is optimized for the desired pattern to be imaged.

When any pattern is illuminated with a coherent beam of radiation, it generates a diffraction pattern and the angles at which the light is diffracted is determined by the spatial frequency components of the pattern. A simple example of this is an infinite line/space pattern which has a single spatial frequency defined by the pitch ($P_x$) of the line/space pattern. The coherent radiation will be diffracted perpendicular to the line/space pattern at angles (or diffraction orders, n) that are defined by the equation:

$$\theta = \sin^{-1}\{(n^*\lambda)/P_x\} \quad [1]$$

An ideal imaging system would capture all of the diffracted radiation and recombine it to form a perfect image of the original line/space pattern. In reality, objectives have a finite angle over which they can capture the diffracted beams and any diffracted radiation beyond this angle is lost. This leads to a degraded reconstruction of the image at the image plane or in the case where none of the diffracted radiation is captured by the imaging system, no imaging at all. The angle over which an imaging system can capture light is determined by the numerical aperture, or the NA, which typically defines the diameter of the lens(es) in the imaging system.

Figure 1B:
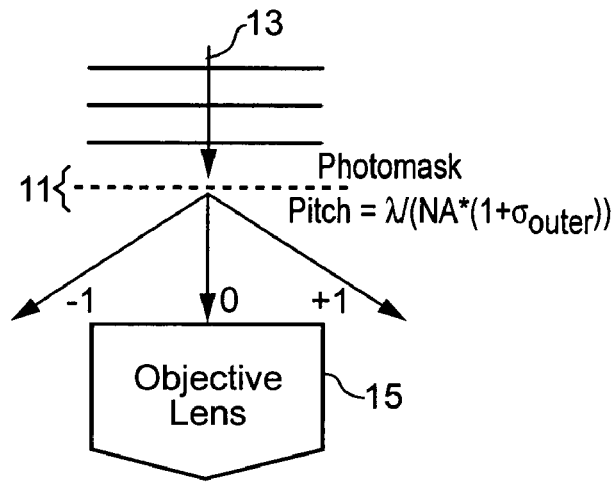

As such, as illustrated in FIGS. 1(a) and 1(b), if a line/space pattern 11 is illuminated with a coherent beam of radiation 13 along the optical axis of an imaging system, the minimum pitch ($P_{min}$) that would still allow for the +/−1 diffraction order to be captured by the lens 15 can be expressed by:

$$P_{min} = \lambda/NA \quad [2]$$

As shown in FIG. 1(a), which illustrates a pattern 11 having a larger pitch, and FIG. 1(b), which illustrates a pattern having a smaller pitch, as the pitch is reduced, it is no longer possible for lens 15 to capture either the +/−1 diffraction order.

Figure 1C:
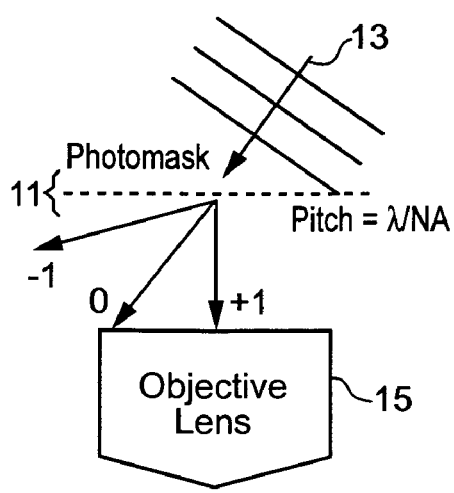
Figure 1D:
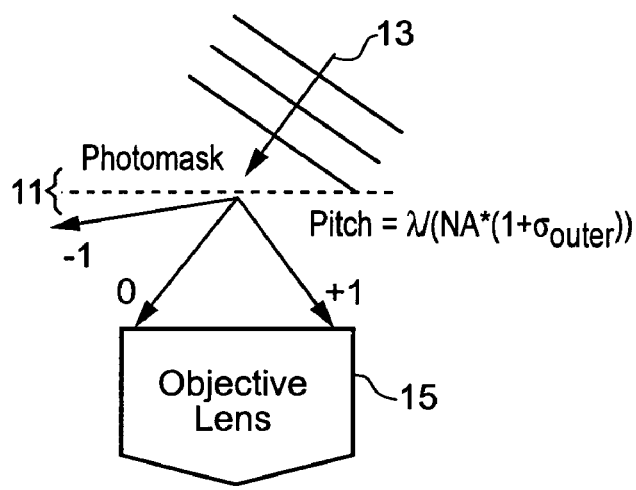

However, referring to FIGS. 1(c) and 1(d), if the coherent beam 13 is moved off the optical axis (off axis illumination or OAI) out to the edge of the imaging system, the +1 diffraction order could then be on the optical axis as shown in FIGS. 1(c) and 1(d). In this case, sigma (σ) approaches a value of 1.0, where σ refers to the ratio between the NA of the illumination lens and the NA of the objective (imaging) lens:

$$\sigma = NA_{ill}/NA_{obj.} \quad [3]$$

However, under this condition, the −1 diffraction order will now be outside the imaging system and will not be captured by the lens 15. This two-beam imaging allows the pitch to be decreased further until the position of the +1 diffraction order is back at the limit of the lens 15 as shown in FIG. 1(d). In this case, σ is defined as $\sigma_{outer}$, and equation [1] is redefined as:

$$P_{min} = \lambda/\{NA^*(1+\sigma_{outer})\} \quad [4]$$

Beyond this limit, imaging cannot occur because it is not possible to capture both the zero and one (either +1 or −1) diffraction order.

As explained in detail below, an embodiment of the method disclosed herein utilizes the foregoing phenomena so that only a portion of the diffraction pattern is captured by the imaging system so as to selectively image only those portions of the diffraction pattern that positively contribute to the desired image.

More specifically, as any mask pattern generates a characteristic diffraction pattern based on the pattern's spatial frequency components, the elements of the diffraction pattern corresponding to the spatial frequency components of the pattern can be collected by an imaging system and imaged at the image plane independently and selectively. Further, patterns which are different, but contain common diffraction elements, are imaged using specific coherency conditions in such a way as to select only the parts of the diffraction pattern that are common to both patterns. As such, it is possible for different patterns to be placed in the object plane (mask patterns) that will create essentially the same image at the image plane.

Figure 2:
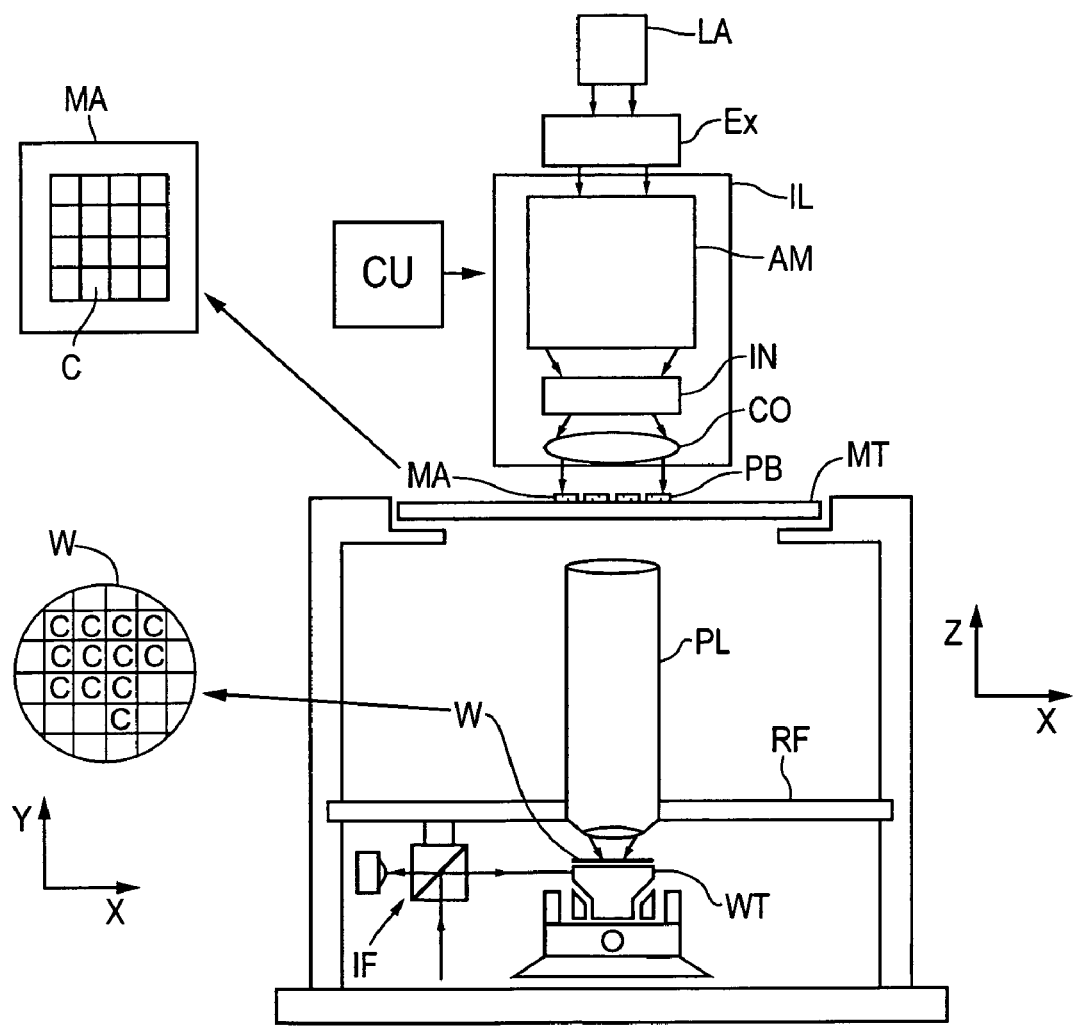
FIG. 2 schematically depicts a lithographic projection apparatus according to an embodiment of the invention.
Figure 3A:
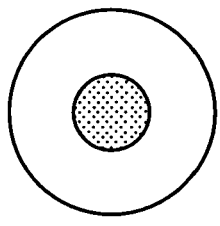
FIG. 3a is a schematic illustration of a small, or low, sigma illumination arrangement.
Figure 3B:
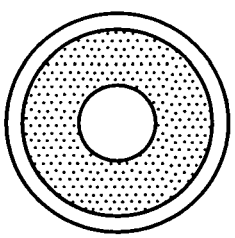
FIG. 3b is a schematic illustration of an annular off-axis illumination arrangement.
Figure 3C:
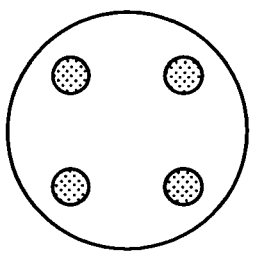
FIG. 3c is a schematic representation of an off-axis quadrupole illumination arrangement.
Figure 3D:
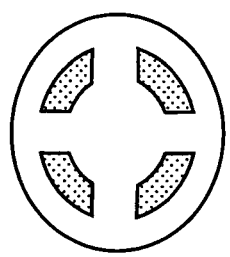
FIG. 3d is a schematic illustration of an off-axis QUASAR illumination arrangement.

FIG. 2 schematically depicts a lithographic projection apparatus according to an embodiment of the present invention. The apparatus includes:

a radiation system Ex, IL, configured to supply a beam PB of radiation. In this particular case, the radiation system also includes a radiation source LA;

a first object table (mask table) MT provided with a mask holder configured to hold a mask MA (e.g., a reticle), and connected to first positioning device configured to accurately position the mask with respect to the projection system ("lens"), item PL;

a second object table (substrate table) WT provided with a substrate holder configured to hold a substrate W (e.g., a resist-coated silicon wafer), and connected to second positioning device configured to accurately position the substrate with respect to a projection system ("lens") PL;

a projection system ("projection lens") PL (e.g., a refractive, catoptric or catadioptric optical system) configured to image an irradiated portion of the mask MA onto a target portion C (e.g., including one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning devices as an alternative to the use of a mask; examples include a programmable mirror array or LCD matrix.

The source LA (e.g. a mercury lamp or excimer laser) produces a beam of radiation. This beam is fed into an illumination system (illuminator) IL, either directly or after having traversed a conditioning device, such as a beam expander Ex, for example. The illuminator IL may include adjusting device AM configured to set the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

Figure 11:
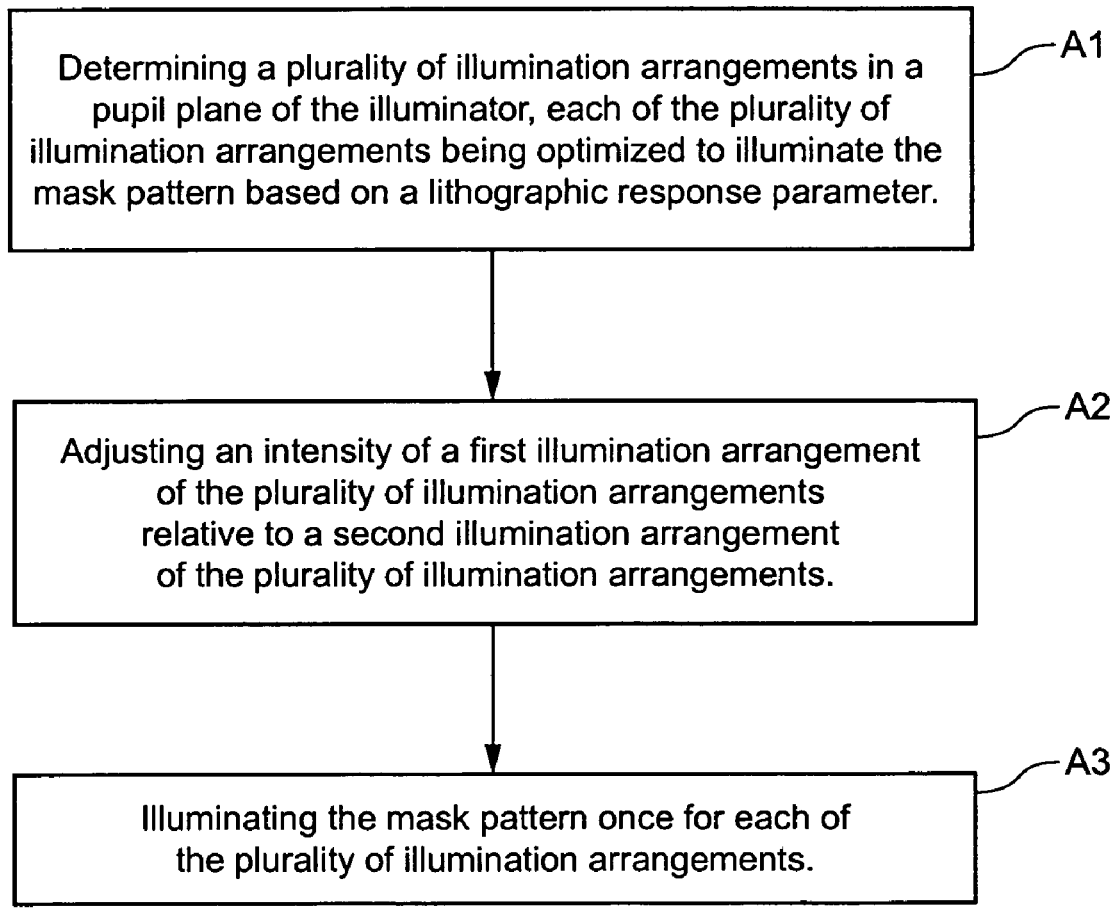
FIG. 11 is a flowchart illustrating a method for optimizing the optical transfer of a mask pattern onto a substrate in accordance with an embodiment of the present invention.

Still referring to FIG. 2, the projection apparatus also includes a control unit CU which may be programmed to execute a method as described herein and illustrated, for example, in FIG. 11 and may be configured to control the different components of the lithographic apparatus. In an embodiment of the invention, control unit CU may include a processor that is configured to control the adjusting device AM and to modify the cross-sectional intensity distribution in the beam exiting the illuminator IL.

It should be noted with regard to FIG. 2 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the projection system PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 2. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected all at once (i.e. a single "flash") onto a target portion C. The substrate table WT is then shifted in the X and/or Y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the Y direction) with a speed v, so that the beam PB is caused to scan over a mask image; concurrently, the substrate table WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes a programmable patterning structure, such as a programmable mirror array of a type as referred to above.

Combinations and/or variations on the above described modes of use or entirely different modes of use may also be employed.

Figure 7:
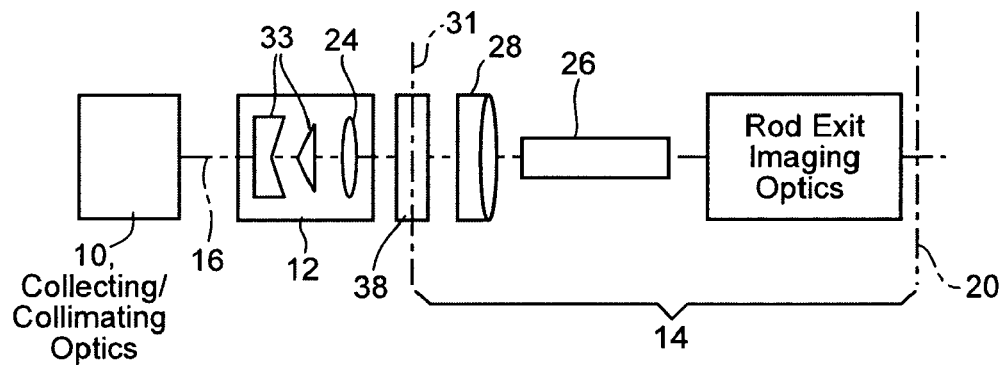
FIG. 7 is a schematic illustration of an illumination system according to an embodiment of the invention.

Referring to FIG. 7, this figure is a schematic representation of an illumination system that can be used to produce illumination patterns within the pupil plane of the illuminator according to an embodiment of the invention. The illumination system may include light collecting/collimating optics 10; an axicon/zoom module 12; a multipole mode generating element 38; and light integrating and projecting optics 14. The components lie along optical axis 16 and are used to illuminate the mask MA located at a mask plane 20 which then produces an exposure pattern in resist on the substrate W via the projection system PL. The illumination system illustrated in FIG. 7 includes a quartz rod light integrator 26. The optical axis 16 shown in FIG. 7 may be folded to produce a more compact illumination system.

Figures 8A, 8B, 9:
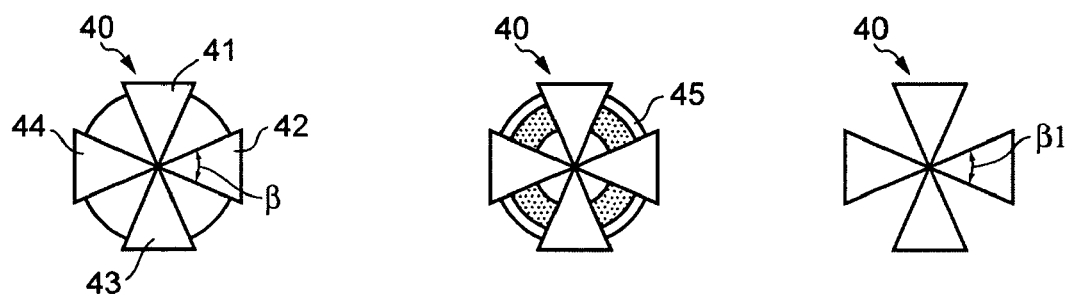
FIG. 8a is a schematic illustration of a multipole mode generating element of the illumination system of FIG. 7.
FIG. 8b is a schematic illustration of a multipole mode generating element according to an embodiment of the invention.
FIG. 9 is a schematic illustration of a multipole generating element according to an embodiment of the invention.

An exemplary embodiment of the multipole mode generating element 38 is shown in FIG. 8a. The element 38 has four triangular blades 41, 42, 43, 44 insertable into the beam path at the pupil plane 31 and which form a Maltese cross 40, which is also referred to herein as a Maltese aperture blade (MAB). Each blade has an apex angle β. FIG. 8b shows the illumination intensity distribution resulting from the combination of an annular illumination mode produced by the axicon/zoom module 12 and the MAB 40. The distribution has four light beams or poles 45. This embodiment enables continuously variable quadrupole illumination modes to be produced. The radial position of each pole 45 can be varied by adjusting the axicon optics 33, the radial width of each pole can be varied by adjusting the zoom lens 24, and the tangential pole width can be changed by inserting another set of blades having a different apex angle β1, such as Maltese cross 40 shown in FIG. 9. By removing the blades altogether, the illumination system can be used for conventional and/or annular modes, again with continuous variation.

Interposing blades of a different apex angle permits the tangential pole width to be changed in discrete steps. According to an embodiment of the invention, the tangential pole width can be continuously varied by each arm of the Maltese cross comprising a stack of n blades, rotatable with respect to each other about the optical axis of the system where their vertices lie.

According to an embodiment, just two blades are used as the multipole mode generating element 38 in an optical system which includes a light pipe, such as a rectangular quartz rod 26, as shown in the illumination system of FIG. 7. One of the blades is oriented parallel to the short side of the rectangular cross-section of the light pipe 26 and the other blade parallel to the long side. Due to the multiple reflections in the pipe 26, the resulting illumination mode is a mixture of annular and quadrupole. The two-blade system can produce an illumination mode including a quadrupole component with lower energy-loss than the Maltese cross arrangement, as there are fewer blades obstructing the light beam. In one example the blades are triangular and are like two perpendicular arms of a Maltese cross, e.g. blades 41 and 42 shown in FIG. 8a. One or both of the blades in this embodiment can be a composite blade including a stack of smaller rotatable blades as described above.

Typically the blades are positioned along directions corresponding to orthogonal lines on the mask MA, so that the light poles 45 are located in each quadrant with centers 45° from the orthogonal lines. This orientation can produce optimal projection of the lines, particularly for dense structures, such as for DRAM-like structures. The orthogonal lines are generally referred to as horizontal and vertical. As pattern features decrease in size, light poles located in each quadrant with centers 90° from the orthogonal lines become more preferred. The optimal sigma for quadrupole illumination can be estimated from the formula: $\sigma = \lambda/(\sqrt{2} \, NA \cdot pitch)$, and for dipole and 45° rotated quadrupole, where the poles are aligned with the horizontal and vertical axes, from: $\sigma = \lambda/(2 \, NA \cdot pitch)$ A further variation on the above embodiments using blades is to make all the blades rotatable about the optical axis 16 of the illumination system so that the position of the poles can be rotated.

Figure 10:
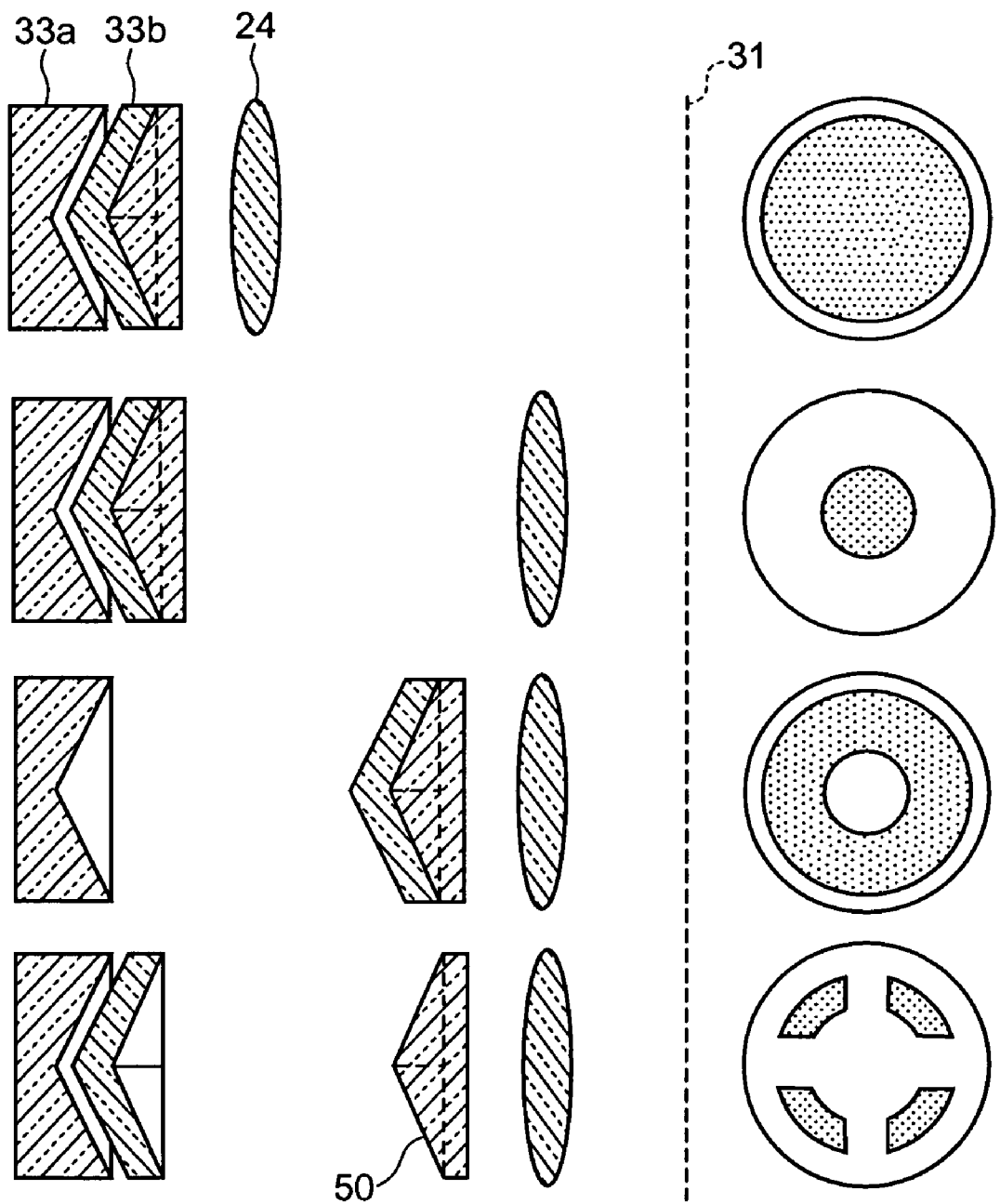
FIG. 10 is a schematic cross section illustration of another illumination system and the resulting illumination arrangements obtainable therewith.

Referring to FIG. 10, an embodiment of the present invention includes the axicon/zoom module with a pyramidal prism 50 as the multipole mode generating element. This also enables conventional, annular and quadrupole illumination to be produced with continuous variations of the modes. FIG. 10 shows the optical components of an axicon/zoom module. The right hand column in FIG. 10 shows the illumination intensity distributions at the pupil plane 31 for various positions of the axicon pair 33a, 33b and zoom lens 24. The axicon pair 33 includes a pair of elements having conical surfaces, one concave 33a, one convex 33b, to produce circular and annular illumination patterns. The fourth row shows the effect of separating the pyramidal prism 50 from convex element 33b. The side of the convex element 33b facing the pyramid 50 is concave pyramidal for receiving the pyramid 50. The convex element 33b and pyramidal prism 50 comprise a second axicon also known as a pyramidal axicon or pyramidon. The pyramidal prism 50 has a four-sided base, which consequently produces quadrupole mode illumination patterns, such as the four spots illustrated at the bottom in the right hand column in FIG. 10.

The axicon/zoom module of FIG. 10 allows the illumination mode to be varied continuously from conventional to annular or quadrupole. The zoom lens 24 sets the spot size or partial coherence factor, the axicon pair 33 determines the annularity, and the pyramidal prism 50 determines the quadrupolarity. In addition, since radiation flux is redistributed rather than blocked, there is virtually no radiation loss, so that a high throughput can be maintained.

It should be understood that off-axis illumination can be created differently in other embodiments of the invention. For example, the illumination patterns can be generated by incorporating a metal aperture plate filter into the fly eye lens assembly of the projection system illuminator, as explained in the foregoing discussion, or using one or more diffractive optical elements.

Referring now to FIG. 11, an exemplary embodiment of a method for optimizing the optical transfer of a mask pattern onto a substrate using a lithographic apparatus will now be explained.

An embodiment of the present invention allows for optimization of any lithographic processes. In an embodiment of the invention, the optimization is done by performing multiple exposures combining simple source shapes/illumination arrangements that can effectively mimic the behavior of a complex source shape. In this embodiment, the lithographic process can be improved without resorting to the use of expensive custom apertures or optics to produce these complex source shapes.

An embodiment of the present invention utilizes multiple exposures with different exposure and coherency such that elements of the diffraction pattern that provide the best imaging of the desired substrate image (or that best define the pattern) can be selected out and exposed independently at exposure energies that are optimized or improved for the pattern components contained in each exposure. Referring back to FIG. 1, by setting the coherency conditions properly during each exposure, unwanted portions of the diffraction pattern can be greatly minimized or eliminated. Further, by combining multiple exposures, the complete image is formed by composite illumination that is optimized or improved for printing the desired pattern and by taking advantage of the non-linear behavior of the resist pattern formation. As a result, it may be possible to image at near 1:1 pitch (e.g., line-to-space ratio) where the pitch is below the exposure wavelength, $\lambda$. Importantly, only a single mask may be utilized, the mask being exposed two or more times utilizing different coherency exposure settings. As such, the problems associated with techniques that require the use of multiple masks, such as double-dipole and complimentary alt-PSM, may be eliminated.

As a result, it is possible to create a pattern, which is different from the desired substrate image, that has a diffraction pattern that includes the elements of a desired pattern (as well as additional unwanted pattern information) that when illuminated with the proper coherency conditions, will result in the formation of the desired image. By properly designing the mask pattern, strong off-axis illumination techniques, such as dipole, may be used with only a single mask. Acquiring the desired image is accomplished by properly controlling the illuminator (controlling the coherency) in a manner that controls which of the complex diffraction orders are captured by the imaging system.

As shown in FIG. 11, an embodiment of the method begins in step (A1) where a plurality of illumination arrangements in the pupil plane of the illuminator is determined. More specifically, each of the plurality of illumination arrangements is optimized or improved to illuminate a mask pattern based on a lithographic performance response parameter (hereinafter, lithographic response parameter).

This optimization or improvement can be done, for example, by computer simulation. In such a case, the simulation calculation may include, in an embodiment of the invention, an aerial image model, which is configured to determine the incident radiation energy distribution onto the resist. Calculation of the aerial image may be done either in the scalar or vector form of the Fourier optics. Practically, this simulation may be carried out with the aid of a commercially available simulator such as Prolith™, Solid-C™, Lithocruiser or the like. In this embodiment, the characteristics of the different elements of the lithographic apparatus, like the numerical aperture (NA) or specific mask patterns, may be entered as input parameters for the simulation.

The image calculated in this embodiment may then be evaluated versus some predetermined criteria to judge whether the image has enough contrast to successfully print the desired feature in resist on the substrate. The aerial image can be analyzed, through a focus range, to provide estimates of the exposure latitude and DOF and the procedure can be performed iteratively to arrive at the best optical conditions. Practically, the quality of the aerial image may be determined by using a contrast or normalized aerial image log-slope (NILS) metric (normalized to the feature size). This value corresponds to the slope of the image intensity (or aerial image).

In an embodiment, key relevant parameters to perform the aerial image simulations may include the distance from the focal plane of the Gaussian image plane, meaning the distance to the plane where the best plane of focus exists, as determined by the geometrical ray optics, or the center wavelength of the quasi-monochromatic radiation source. The parameters may also include a measure of degree of spatial partial coherence of the illumination system, the numerical aperture of the projection system exposing the substrates, the aberrations of the optical system and a full description of the spatial transmission function representing the mask.

In another embodiment of the invention, the simulation model may include a resist model. In an implementation, the resist model should take into account, in the calculation of the critical dimension (or size) and its variation with variables such as dose/exposure energy and focus, the resist exposure, the resist baking and the resist developing. Other responses, such as dense/isolated feature biases, side lobe printing and mask error enhancement factors, may be defined and modeled by the simulation software.

Likewise, the resist model may take into account, in an embodiment of the invention, a nonplanar topography and vector effects. The vector effects refer to the fact that the electromagnetic wave propagates obliquely when high numerical apertures are used. Although these vector effects can be accounted for when calculating the aerial image, a calculation of the vector effects in air greatly overestimates the contrast loss obtained on the substrate. This is due to the fact that the incident rays tend to be straightened when they propagate in the resist because of the resist's higher refractive index. Therefore, a resist model with a rigorous electromagnetic calculation will be preferable to accurately determine the actual experimental response.

It should be understood that selection of the simulation model to determine the plurality of illumination arrangements in step (A1) is by no means limited to an aerial image model or a resist model. Additional models like a lumped parameter model or a variable threshold resist model may also be used in other embodiments of the invention. Typically, the model is selected because it has been matched to experimental data.

It should also be understood that the use of simulation in step (A1) is not limited to the calculation of the resist profile and that simulations may be carried out to extract additional/complementary responses like process latitude, dense/isolated feature biases, side lobe printing and sensitivity to mask errors.

Still referring to step (A1), after defining the simulation model and the key relevant parameters, the optimization or improvement of each of the plurality of illumination arrangements based on a lithographic response parameter may proceed, in an embodiment of the invention, by defining a grid of radiation beam points, which represents a discretization of the radiation beam in the pupil plane of the illuminator.

Figure 4:
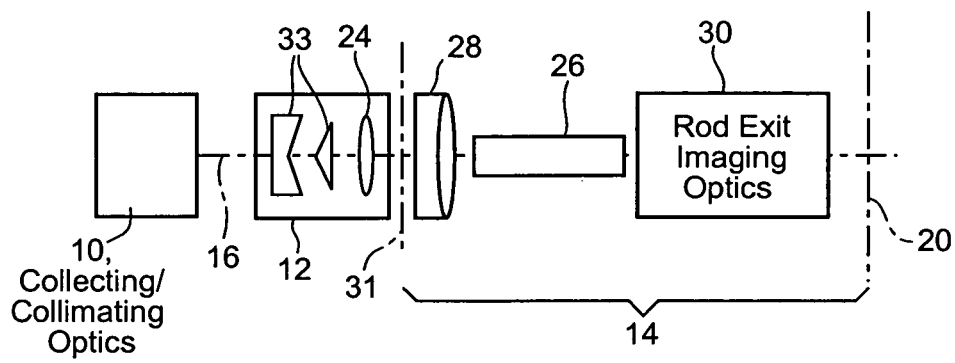
FIG. 4 is a schematic representation of an illumination system.
Figure 5:
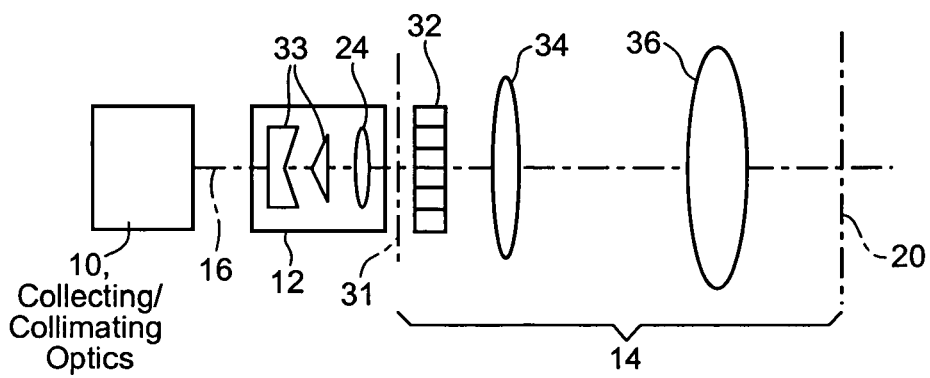
FIG. 5 is a schematic representation of another illumination system.
Figure 6:
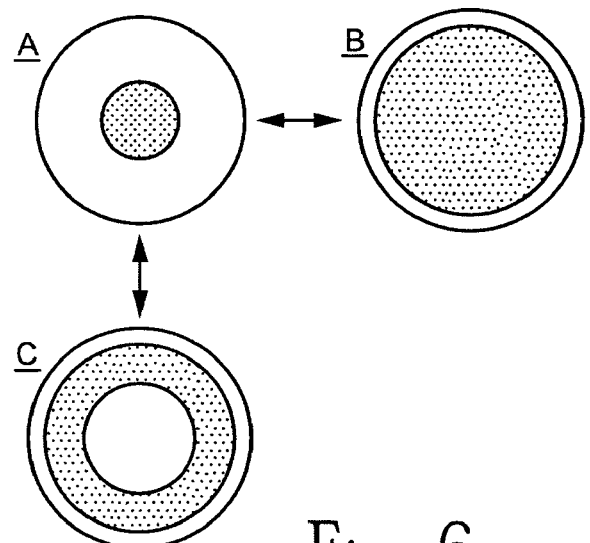
FIG. 6 is a schematic illustration of illumination arrangements obtainable with the illumination arrangements of FIGS. 4 and 5.
Figure 12A:
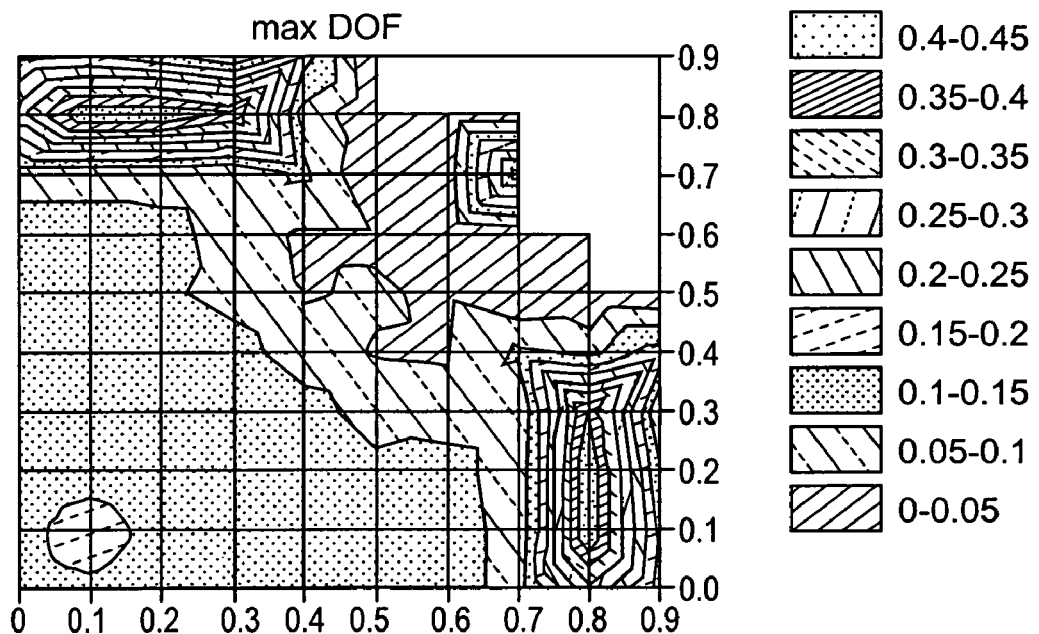
FIG. 12a is a contour map illustrating the value of depth of focus as a function of source point location for a specific mask pattern (75 nm trenches printed with an 6% attenuated phase shift mask).
Figure 12B:
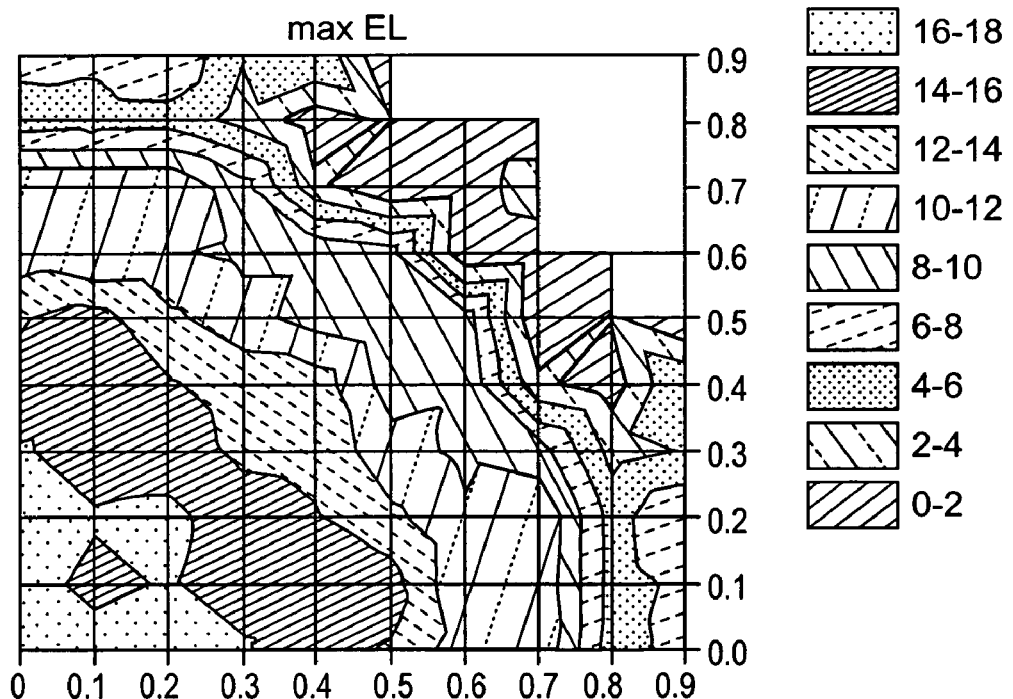
FIG. 12b is a contour map illustrating the value of exposure latitude as a function of source point location for a specific mask pattern (75 nm trenches printed with an 6% attenuated phase shift mask).

More specifically, one or more illumination files representing the individual grid points are generated and loaded in the simulation software. The radiation beam points contained in the files form a point grid that spatially covers the entire cross-section of the illuminator at the pupil plane 31 of the illumination system shown in FIGS. 4, 5 and 7. The response of the lithographic projection apparatus is calculated for each grid point. The response can represent a result or series of results of simulations using the simulation models. Potential responses may include, for example, a critical dimension of the mask pattern studied or an intensity threshold necessary to define the target CD on the substrate. The results of the individual responses may be plotted on a contour map, such as shown in FIGS. 12a–b. Quantitative analysis of the individual radiation beam points results allows for determination of an optimal illumination arrangement. Additional information related to the calculation of an optimal illumination arrangement by computer simulation can be gleaned in U.S. patent application Ser. No. 10/361,831, filed on Feb. 11, 2003, entitled "Method for Optimizing an Illumination Source Using Full Resist Simulation and Process Window Metric", U.S. patent application Ser. No. 10/716,439, filed on Nov. 20, 2003, entitled "Lithographic Apparatus and Method for Optimizing an Illumination Source Using Isofocal Compensation", and U.S. patent application Ser. No. 10/773,397, filed on Feb. 9, 2004, entitled "Lithographic Apparatus And Method For Optimizing An Illumination Source Using Photolithographic Simulations". The contents of these applications are incorporated herein in their entirety by reference.

The physical location of each of the radiation beam points relative to the full illuminator aperture is set in the individual radiation beam points file(s) and can be varied depending on the degree of accuracy desired. A small spacing between each radiation beam point will provide more detailed information on the beam response but may notably increase the calculation time. Conversely, a large spacing between each radiation beam point may provide less accurate information on the beam response but will significantly decrease the calculation time. In an embodiment of the invention, the spacing of the grid relative to the full illuminator aperture is approximately 0.1. In other embodiments, the grid spacing is approximately 0.01 to 0.2. In an embodiment of the invention, a linearly interpolated grid may be used in combination with a smaller grid spacing.

It should be understood that the grid of radiation beam points may be defined differently in other embodiments of the invention. For example, as an alternative to illumination file(s), the grid of radiation beam points may be specified parametrically in the calculation.

Still referring to step (A1) in FIG. 11, the plurality of illumination arrangements is optimized or improved to illuminate a mask pattern based on a lithographic response parameter. In an embodiment of the present invention, potential lithographic response parameters may include the depth of focus (DOF), the exposure latitude (EL), the depth of focus at 8% EL (DOF@8% EL), the dose-to-size $E_{1:1}$, dense to isolated feature bias, arbitrary feature size bias, sidelobe printing, film loss, sidewall angle, mask error enhancement factor (MEEF), linear resolution, absolute resolution, CD uniformity or any combination thereof.

FIGS. 12a–b illustrate examples of contour maps that can be used in step (A1) to determine the plurality of optimized/improved illumination arrangements. In this embodiment of the invention, two lithographic response parameters, i.e. the depth of focus and the exposure latitude, have been selected to determine illumination arrangements optimized/improved for these responses in step (A1). These figures correspond to the upper right hand quadrant of the illuminator at the pupil plane 31. As can be seen in FIGS. 12a–b, the source point grid has a 0.1:0.1 spacing relative to the full aperture of the illuminator. When examining simple symmetrical structures having both horizontal and vertical orientations, only the upper right hand quadrant of the illuminator need be visualized for symmetry reasons.

In FIGS. 12a–b, the mask pattern studied is a pattern of 75 nm trenches printed with a 6% attenuated phase shift mask (6% Att-PSM). In this embodiment of the invention, the wavelength of the radiation beam is 193 nm and the numerical aperture of the lithographic projection apparatus is 0.93. Simulations are performed with a 15 nm mask bias, which means that the 1× size of the trenches on the mask is 90 nm (the 1× referring to the scaled-size).

In the contour map illustrated in FIG. 12a, the lithographic response parameter studied is the maximum depth of focus (μm) (max DOF) and the simulations are performed with a resist model. This contour map represents the calculated value of highest DOF obtained on the wafer as a function of radiation beam point position in the illuminator. As can be seen in this figure, only the radiation beam points located at the extreme top and extreme right regions of the illuminator (i.e. a radius of 0.8 to 0.9) will give large depth of focus (max DOF). These regions are effective for horizontal and vertical orientation of the features, respectively. Illumination emanating from this region is favorable in terms of DOF whereas illumination from outside this region is deemed unfavorable. It is therefore expected that a favorable process window for this particular mask pattern will require illumination poles centered on the 0 and 90° axes (C-Quad illumination). The performance of this C-Quad illumination arrangement can then be determined, for example, by averaging the responses due to the individual radiation beam points captured by the illuminator.

FIG. 12b represents another contour map that illustrates the variation of maximum exposure latitude (%) (max EL) as a function of radiation beam point location. Similarly to FIG. 12a, simulations were performed using a calibrated resist model, a 193 nm wavelength, a 15 nm bias and a 0.93 NA. This contour map indicates that the region proximate the center of the illuminator will provide a robust lithographic process in terms of exposure latitude. Conversely, the regions near the perimeter of the illuminator do not yield good exposure latitude. This result shows that a small sigma illumination will give favorable dose latitude, though low depth of focus (FIG. 12a).

Figure 13A:
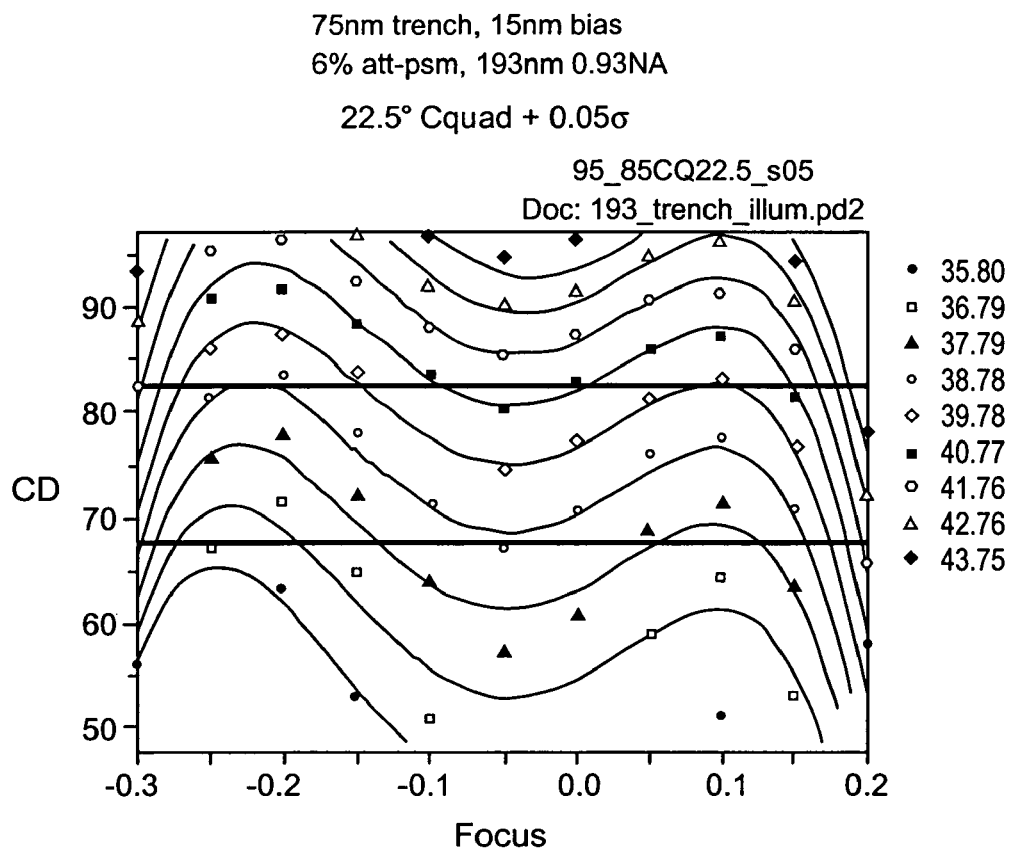
FIG. 13a is a Bossung plot showing the simulated variation of the critical dimension of the trenches as a function of defocus for several exposure energies after optimization of the illumination conditions. The trenches are illuminated with a 22.5° Cquad+0.05 σ arrangement. The C-Quad poles are set at a radius of 0.95/0.85.
Figure 13B:
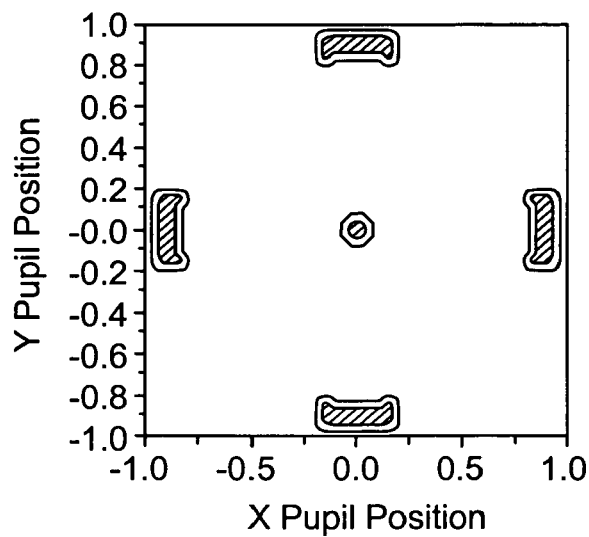
FIG. 13b is an illumination arrangement at the pupil plane of the illuminator that combines information related to depth of focus and exposure latitude and having a 22.5° Cquad+ 0.05 σ illumination.
Figure 14:
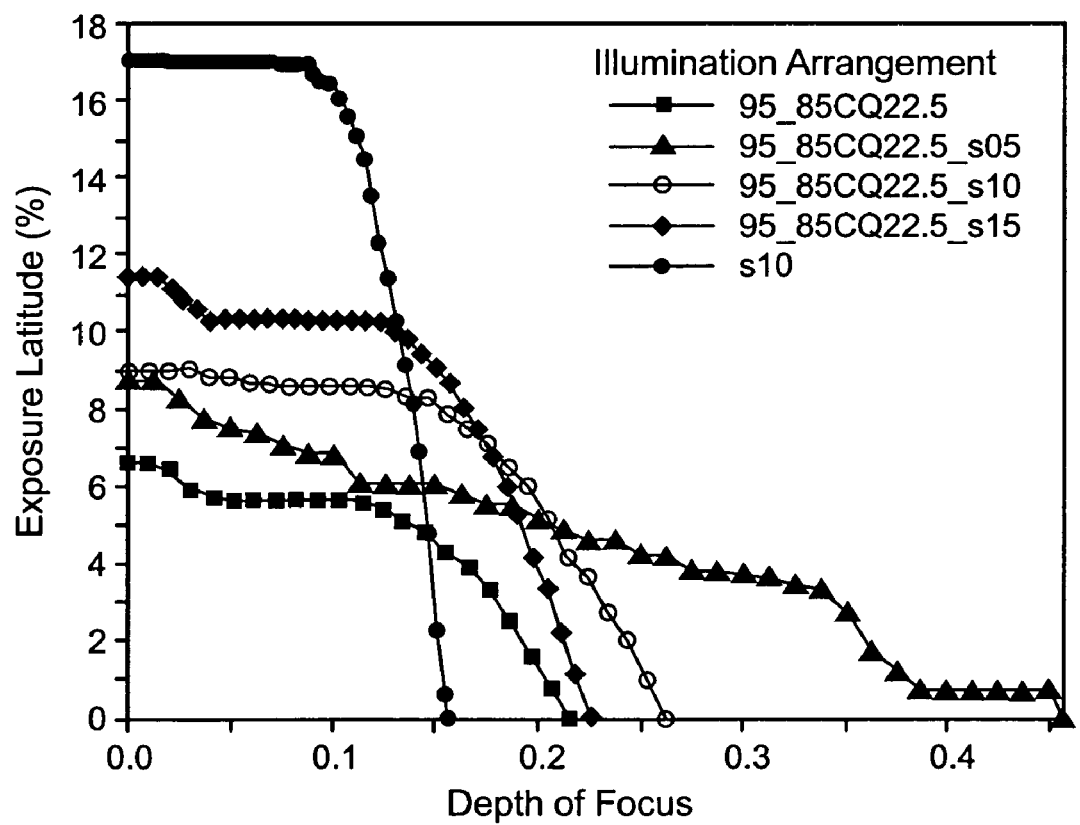
FIG. 14 shows the variation of exposure latitude as a function of defocus for several illumination arrangements (22.5° Cquad; 22.5° Cquad+0.05 σ; 22.5° Cquad+0.1 σ; 22.5° Cquad+0.15 σ; 0.10 σ).

Analysis of the contour maps of FIGS. 12a–b suggests that the lithographic process can potentially be improved by combining a C-Quad illumination with a small sigma illumination. FIG. 13a represents a Bossung plot obtained with this complex combined illumination (the C-Quad poles are set at a radius of 0.95/0.85 and opening angle 22.5° and the small sigma pole has a 0.05 size relative to the full illuminator aperture). For reference, this complex illumination arrangement is illustrated in FIG. 13b, which represents a cross-section of the intensity distribution at the pupil plane of the illuminator. The Bossung plot of FIG. 13a shows the variation of the critical dimension (CD) of the trench as a function of defocus for different exposure energies (mJ). As can be seen in this graph, an average dose of $E_{average}=38.78$ mJ can be used to expose the trenches within specification (i.e. between about 68 nm–82 nm) throughout a wide focus range. Referring now to FIG. 14, this graph illustrates the variation of exposure latitude as a function of depth of focus for different illumination arrangements (22.5° C-quad illumination, 22.5° C-quad illumination+0.05 σ, 22.5° C-quad illumination+0.10 σ, 22.5° C-quad illumination+0.15 σ). It can be seen that there is a trade-off of dose latitude as the proportion of on-axis illumination is decreased, but a maximum in depth of focus (DOF) can be found where the process becomes approximately isofocal. The fixed Cquad setting with a 0.05 σ central pole provides highest DOF and maintains reasonably high dose latitude.

It follows from the foregoing discussion, that the ability to significantly increase the process window for this specific mask pattern (75 nm trenches) clearly depends on the ability to produce such a complex source shape, i.e. a C-quad illumination+0.05 σ. Unfortunately, experiments have shown that an illumination with a small 0.05 σ arrangement may be difficult to reproduce with currently available beam shapers. It is believed that such an illumination may only be done by using expensive custom beam shaping elements.

Therefore, in order to mimic the behavior of complex beam shapes without resorting to the use of excessively complex custom beam shaping elements, the method according to an embodiment of the present invention proceeds to step (A2), where the relative intensity of at least two of the plurality of illumination arrangements is modified. More specifically, the effective complex illumination is fine-tuned by "intensity balancing" the different illumination arrangements. In that way, it may be possible to mimic the results obtained with a complex illumination arrangement by using alternative illumination arrangements that can easily be created with conventional beam shapers.

In the embodiment of the invention illustrated in FIGS. 12a–b, this means that the small sigma illumination (0.05 σ) could be mimicked/reproduced, for example, by increasing the size of the sigma pole while, at the same time, decreasing its intensity.

Figure 15A:
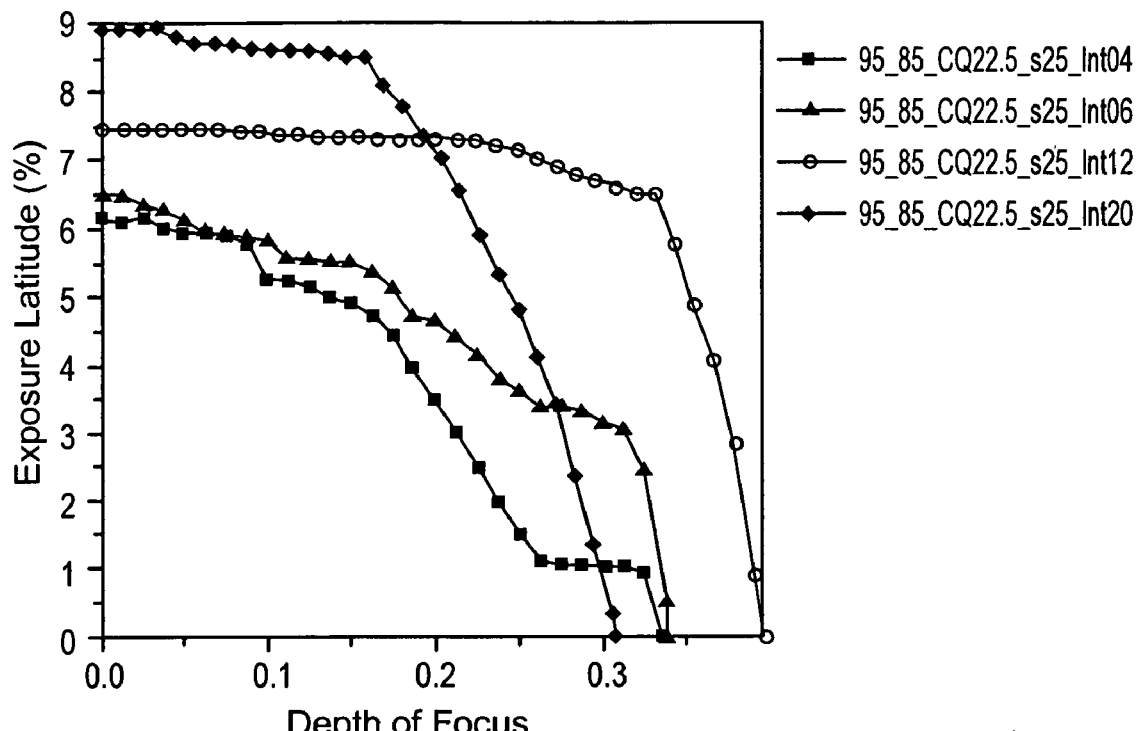
FIG. 15a shows the variation of exposure latitude (%) as a function of defocus for several illumination conditions. Trenches are illuminated twice: once with a 22.5° Cquad arrangement and once with a 0.25 σ arrangement.

Referring now to FIG. 15a, this figure illustrates simulation results for the process window size obtained via pole intensity tuning. In FIG. 15a, the intensity of the central small sigma pole has been varied in a range from 4% to 20% while its size, relative to the full illuminator aperture, has been increased from 0.05 to 0.25. This new size pole corresponds to a pole arrangement that can easily be reproduced with a standard off-axis illuminator, e.g. the axicon/zoom elements of FIG. 7.

Figure 15B:
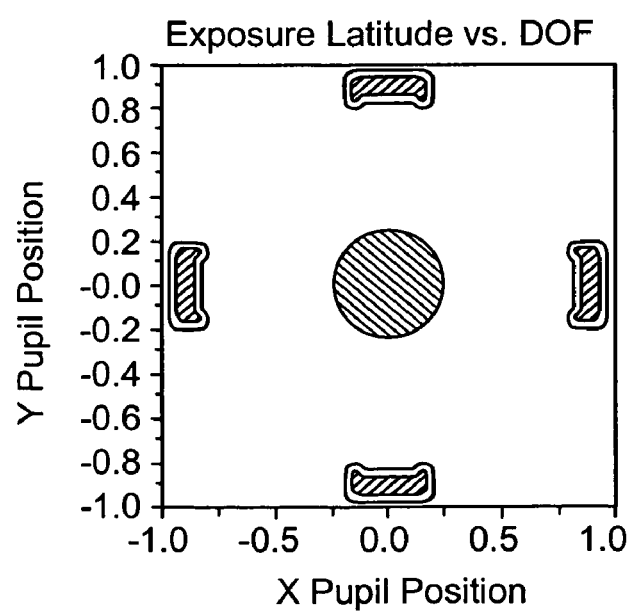
FIG. 15b represents the two separate illumination arrangements that are used in FIG. 35a. The first arrangement is a 22.50 Cquad and the second one is a 0.25 σ arrangement.

As can be seen in FIG. 15a, a pole intensity of about 12% provides good results in terms of high DOF with reasonable exposure latitude. Furthermore, comparison of the data of FIGS. 15a and 14 indicates that results obtained with a 0.25 σ pole and a 12% intensity (0.25 σ+12%) are at least as good as those obtained with a 0.05 σ pole (0.05 σ). For example, it should be noted that the exposure latitude (0.25 σ+12%) in FIG. 15a remains substantially constant (7.5%) within the 0.35 μm defocus range. By contrast, the exposure latitude (0.05 σ) in FIG. 14 is divided by almost a factor of 3 within that range. These results show that it is possible to eliminate the practical problems encountered with creating complex beam shapes and to develop a robust lithographic process by 1) performing multiple exposures with simpler shapes/illumination arrangements, or 2) performing a single exposure with an intensity-optimized more complex shape. For reference, FIG. 15b represents the intensity distribution regions at the pupil plane of the illuminator after intensity balancing. As can be seen in this figure, the central pole is much larger than the original 0.05 σ pole.

It should be noted that the relative intensity of the different illumination arrangements can be estimated, in an embodiment of the invention, by weighting the different regions in the pupil plane, i.e. by calculating the relative sizes of these regions. Practically, in FIGS. 12a–b and 13b, the exposure dose/energy of the 0.05 σ pole could be determined by comparing the spatial area of this region with the area defined by the C-Quad poles. The ratio of these areas could then be applied to the total dose, $E_{total}$, to determine the exposure doses/energies that should be associated with the various source features (i.e. a 0.05 σ illumination and a C-Quad illumination). In other words, a dose weighted average is determined for each of the illumination arrangements. The ratio can then be used to estimate the attenuation factor needed for larger poles using the same principle. Experimental verification can then be used to optimize the weighting of the different regions found by simulation.

After adjusting the relative intensity/dose of the illumination arrangements, the method then proceeds to step A3 where the mask pattern is illuminated once for each of these illumination arrangements. In other words, temporally separated exposures are performed. Practically, in the example given in FIGS. 12–15, a first illumination/exposure will be done with a 0.25 σ pole and a second one with a C-Quad illumination.

Figure 16:
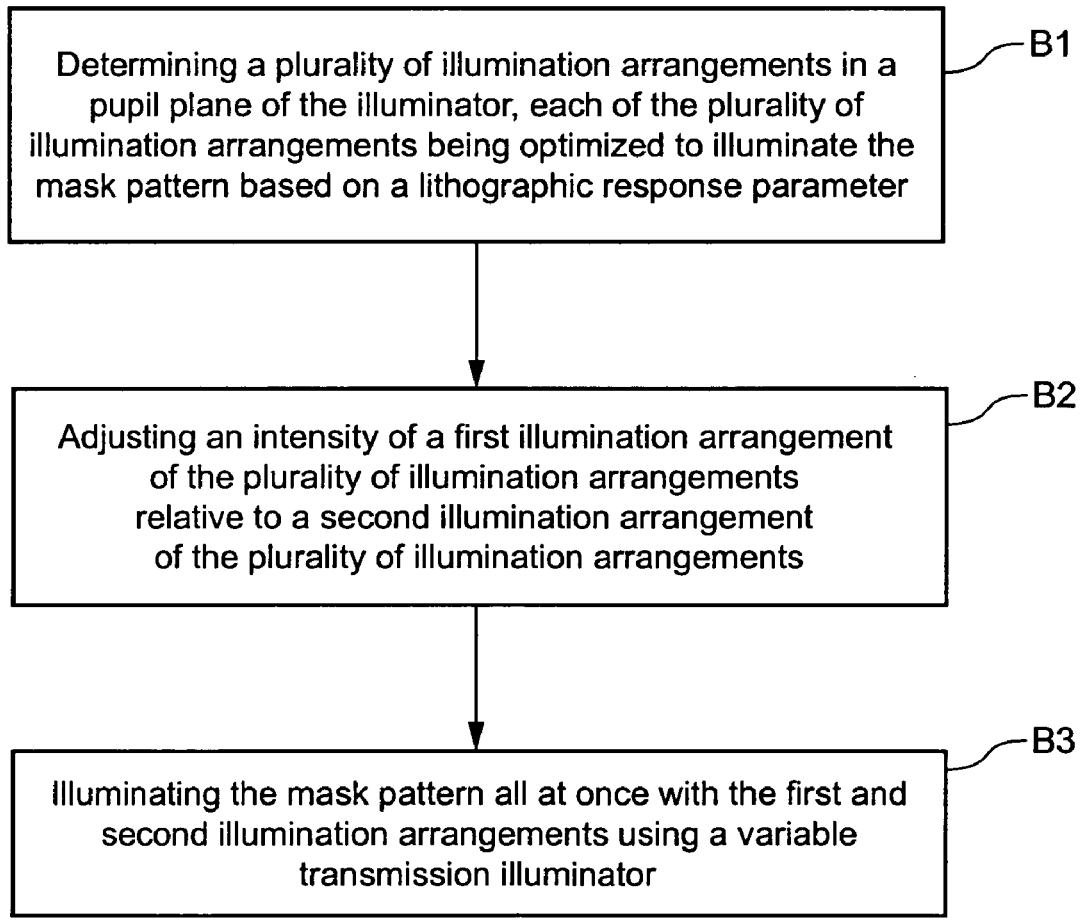
FIG. 16 is a flowchart illustrating a method for optimizing the optical transfer of a mask pattern onto a substrate in accordance with an embodiment of the present invention.

FIG. 16 illustrates a flowchart of a method according to an embodiment of the invention for optimizing the optical transfer of a mask pattern onto a substrate using a lithographic apparatus.

In FIG. 16, the method begins in step B1 and proceeds to step B2 in the same way as in the method of FIG. 11. That is, a plurality of illumination arrangements is determined in step B1. In case a 75 nm trench pattern is studied, this means that the lithographic process can potentially be improved by combining a C-Quad illumination with a small sigma illumination (See FIGS. 12a–b, 13 and 14). Then, the intensity of a first illumination arrangement of the plurality of illumination arrangements relative to a second illumination arrangement of the plurality of illumination arrangements is adjusted in step B2. An analysis similar to the one conducted previously will indicate that a pole intensity of about 12% provides good results in terms of high DOF with reasonable exposure latitude for the 75 nm trench pattern (See FIG. 15). Then, the method proceeds to step B3, where the mask pattern is exposed with a variable transmission illuminator.

In this embodiment of the invention, the variable transmission illuminator is configured to expose the mask pattern with different illumination arrangements having different intensities all at once. In such a case, the illumination system IL of the lithographic apparatus represented in FIG. 2 is the variable transmission illuminator. Practically, this means that the trench pattern discussed above can be exposed in a single exposure with the illumination arrangements shown in FIG. 15b. It will be appreciated that this single exposure can be made up of many laser pulses to allow for a better dose control.

It will be appreciated that the intensity of each of the poles that constitutes a multipole illumination arrangement, e.g. a C-Quad or a quadrupoles, could conceivably be adjusted using an embodiment of the present invention. Furthermore, it should be understood that this method is not limited/restricted to the optimization of only two illumination arrangements. Thus, the intensity balancing can be extended to cases where more than two illumination arrangements are used. In addition, it should be understood that optimization of the illumination conditions and of the optical transfer of the mask pattern can be done regardless of the nature of the mask used (binary mask, attenuated phase shift mask or chromeless phase lithography (CPL) mask) or the mask pattern studied.

While in the above described embodiments, the size of a selected region (e.g. 0.05 σ pole) and its intensity/dose have been changed at the same time, it will be appreciated that intensity tuning can be done in an embodiment of the invention by adjusting the size of region without adjusting its associated dose. Alternatively, it will also be appreciated that the dose associated with a region may be adjusted, in another embodiment of the invention, without changing the size of the region.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

What is claimed is:

1. A method for optimizing the optical transfer of a mask pattern onto a substrate using a lithographic apparatus, the lithographic apparatus including an illuminator configured to illuminate the mask pattern, the method comprising:
   determining a plurality of illumination arrangements for a pupil plane of the illuminator, each of the plurality of illumination arrangements being determined to improve a respective lithographic performance response parameter when illuminating the mask pattern; and
   adjusting an intensity of a first illumination arrangement of the plurality of illumination arrangements relative to a second illumination arrangement of the plurality of illumination arrangements, the mask pattern to be illuminated with the first and second illumination arrangements.

2. A method according to claim 1, further comprising illuminating the mask pattern at least once for each of the first and second illumination arrangements.

3. A method according to claim 1, further comprising illuminating the mask pattern all at once with at least the first illumination arrangement and the second illumination arrangement.

4. A method according to claim 3, wherein a variable transmission illuminator is used to illuminate the substrate with the first and the second illumination arrangements.

5. A method according to claim 1, wherein the determination of the plurality of illumination arrangements is done by computer simulation.

6. A method according to claim 1, wherein the adjusting includes determining an appropriate weighting of the first and second illumination arrangements to optimize the optical transfer of the mask onto the substrate.

7. A method according to claim 6, wherein the determination of the optimum weighting is done by computer simulation or by experimental optimization.

8. A method according to claim 7, wherein determining an appropriate weighting includes experimentally optimizing the weightings determined by computer simulation.

9. A method according to claim 1, wherein determining a plurality of illumination arrangements comprises identifying, for each of the plurality of illumination arrangements, a region in the pupil plane for which it optimizes the optical transfer of the mask pattern.

10. A method according to claim 9, wherein adjusting an intensity of the first illumination arrangement relative to the second illumination arrangement comprises varying the region in the pupil plane of the first or second illumination arrangement.

11. A method according to claim 9, wherein adjusting an intensity of the first illumination arrangement relative to the second illumination arrangement comprises adjusting an exposure dose of the first or second illumination arrangement.

12. A method according to claim 11, wherein adjusting an exposure dose of the first or second illumination arrangement comprises determining a dose weighted average.

13. A method according to claim 1, wherein the lithographic performance response parameter includes depth of focus, exposure latitude, dose-to-size E1:1, dense to isolated feature bias, lens aberrations, arbitrary feature size bias, sidelobe printing, film loss, sidewall angle, mask error enhancement factor, linear resolution, absolute resolution or any combination thereof.

14. A method according to claim 5, wherein determining a plurality of illumination arrangements for a pupil plane of the illuminator comprises:
    selecting a grid of beam points for the pupil plane of the illuminator; and
    calculating, for the parameter, responses for individual beam points to an illumination arrangement, each response representing a result of a single or series of simulations using a simulation model.

15. A method according to claim 14, further comprising mapping the responses as a function of individual beam point positions.

16. A method according to claim 14, wherein the simulation model comprises a full resist model, an aerial image model, a lumped parameter model or a variable threshold resist model.

17. A method according to claim 14, wherein the responses comprise a critical dimension of the mask pattern or an intensity threshold and the parameter comprises depth of focus, exposure latitude, dose-to-size E1:1, dense to isolated feature bias, lens aberrations, arbitrary feature size biases, sidelobe printing, film loss, sidewall angle, mask error enhancement factor, linear resolution, absolute resolution or any combination thereof.

18. A method according to claim 14, wherein the simulation model comprises a resist model calibrated to adequately predict experimental results.

19. A method according to claim 14, wherein the grid is interpolated to increase the grid point density to aid in averaging.

20. A method according to claim 1, further comprising varying a position of an axicon/zoom module or a pyramidal prism relative to the other, varying a position of a diffractive optical element, varying a position of an aperture blade, or adjusting a programmable mirror array.

21. A method according to claim 1, wherein the plurality of illumination arrangements is two illumination arrangements.

22. A method according to claim 1, wherein the plurality of illumination arrangements includes a four pole arrangement and a central pole, said four pole arrangement comprising a Quasar, a C-Quad, a quadrupole, or a rotated quadrupole.

23. A method according to claim 1, wherein the lithographic performance response parameter includes CD uniformity.

24. A lithographic projection apparatus comprising:
    an illumination system to condition a beam of radiation;
    a support structure to hold a patterning structure which can be used to pattern the beam of radiation according to a desired pattern;
    a substrate table to hold a substrate;
    a projection system to project the beam of radiation onto a target portion of the substrate;
    a processor to determine a plurality of illumination arrangements for a pupil plane of the illumination system, each of the plurality of illumination arrangements being determined to improve a respective lithographic performance response parameter when illuminating the desired pattern, said processor adjusting an intensity of a first illumination arrangement of the plurality of illumination arrangements relative to a second illumination arrangement of the plurality of illumination arrangements; and
    a selectable variable beam controller that is configured to modify a cross-sectional intensity distribution of the beam exiting the illumination system in accordance with the plurality of illumination arrangements determined and adjusted by the processor.

25. A lithographic projection apparatus according to claim 24, wherein the processor is further configured to identify, for each of the plurality of illumination arrangements, a region in the pupil plane for which it optimizes the optical transfer of the mask pattern.

26. A lithographic projection apparatus according to claim 25, wherein the selectable variable beam controller is further configured to vary the region in the pupil plane of the first or second illumination arrangement.

27. A lithographic projection apparatus according to claim 25, wherein the processor is further configured to adjust an exposure dose of the first or second illumination arrangement.

28. A lithographic projection apparatus according to claim 27, wherein the processor is further configured to determine a dose weighted average of the first or second illumination arrangement.

29. A lithographic projection apparatus according to claim 25, wherein the lithographic performance response parameter includes depth of focus, exposure latitude, dose-to-size E1:1, dense to isolated feature bias, lens aberrations, arbitrary feature size bias, sidelobe printing, film loss, sidewall angle, mask error enhancement factor, linear resolution, absolute resolution or any combination thereof.

30. A machine readable medium encoded with machine executable instructions for optimizing an illumination arrangement of an illuminator according to a method comprising:
    determining a plurality of illumination arrangements for a pupil plane of the illuminator, each of the plurality of illumination arrangements being determined to improve a respective lithographic performance response parameter when illuminating a mask pattern; and
    adjusting an intensity of a first illumination arrangement of the plurality of illumination arrangements relative to a second illumination arrangement of the plurality of illumination arrangements, the mask pattern to be illuminated with the first and second illumination arrangements.

31. A machine readable medium according to claim 30, wherein determining a plurality of illumination arrangements comprises identifying, for each of the plurality of illumination arrangements, a region in the pupil plane for which it optimizes the optical transfer of the mask pattern.

32. A method according to claim 31, wherein adjusting an intensity of the first illumination arrangement relative to the second illumination arrangement comprises varying the region in the pupil plane of the first or second illumination arrangement.

33. A method according to claim 31, wherein adjusting an intensity of the first illumination arrangement relative to the second illumination arrangement comprises adjusting an exposure dose of the first or second illumination arrangement.

34. A method according to claim 33, wherein adjusting an exposure dose of the first or second illumination arrangement comprises determining a dose weighted average.

35. A method according to claim 30, wherein the lithographic performance response parameter includes depth of focus, exposure latitude, dose-to-size E1:1, dense to isolated feature bias, lens aberrations, arbitrary feature size bias, sidelobe printing, film loss, sidewall angle, mask error enhancement factor, linear resolution, absolute resolution or any combination thereof.

* * * * *